(12) United States Patent
Julson

(10) Patent No.: US 9,239,350 B2
(45) Date of Patent: Jan. 19, 2016

(54) METHODS AND APPARATUS FOR DETERMINING ABNORMAL CONDITIONS IN VEHICULAR ELECTRICAL SYSTEM

(71) Applicant: GM Global Technology Operations LLC, Detroit, MI (US)

(72) Inventor: Timothy D. Julson, Rochester Hills, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 184 days.

(21) Appl. No.: 13/771,234

(22) Filed: Feb. 20, 2013

(65) Prior Publication Data
US 2013/0226398 A1     Aug. 29, 2013

Related U.S. Application Data

(60) Provisional application No. 61/605,034, filed on Feb. 29, 2012.

(51) Int. Cl.
    *G01R 31/00*     (2006.01)

(52) U.S. Cl.
    CPC ................. *G01R 31/007* (2013.01)

(58) Field of Classification Search
None
See application file for complete search history.

(56) References Cited

U.S. PATENT DOCUMENTS 5,530,360 A * 6/1996 Kerchaert ............... B60T 8/885
                                                           324/379

6,144,903 A * 11/2000 Tousignant ......... G01M 17/007
                                                       340/636.12

2006/0119368 A1    6/2006   Sela et al.
2010/0277198 A1   11/2010   Liang et al.

FOREIGN PATENT DOCUMENTS

CN        101399435 A      4/2009
EP          1501167 A2      1/2005

OTHER PUBLICATIONS

Cabletool Multifunction Cable Meter User's Guide, Psiber Data Systems, Inc. CableTool, psiber and the Psiber logo are trademarks of Psiber Data Systems Inc. Copyright 2002. 1005-0500-000 Rev C.
Cabletool Multifunction Cable Meter Brochure, Psiber Data Systems, Inc. CableTool, psiber and the Psiber logo are trademarks of Psiber Data Systems Inc. Copyright 2002. 0101-0025-0001.
Yanwei, et al., "Research on Intelligent Fault Diagnosis Method of Armored Vehicles Power System," Computer Measurement & Control, Jun. 30, 2011, pp. 1410-1412 and 1419, vol. 19, No. 6.
State Intellectual Property Office of the People'S Republic of China, Office Action in Chinese Patent Application No. 201310063381.3, mailed Dec. 22, 2014.

* cited by examiner

*Primary Examiner* — Mussa A Shaawat
*Assistant Examiner* — Abdhesh Jha
(74) *Attorney, Agent, or Firm* — Ingrassia Fisher & Lorenz, P.C.

(57) ABSTRACT

Methods and apparatus are provided for determining an abnormal condition in an electrical system of a vehicle. The apparatus includes a memory for storing data relating to normal voltage transients. The apparatus also includes a computer electrically connectable to the electrical system and in communication with the memory. The computer is configured to sense voltage transients that occur in the electrical system of the vehicle, compare the sensed voltage transients to the stored normal voltage transients, and determine if the sensed voltage transient indicates an abnormal condition in the electrical system of the vehicle.

13 Claims, 2 Drawing Sheets

METHODS AND APPARATUS FOR DETERMINING ABNORMAL CONDITIONS IN VEHICULAR ELECTRICAL SYSTEM

CROSS REFERENCE TO RELATED APPLICATIONS

This application claims the benefit of U.S. Provisional Application No. 61/605,034, filed Feb. 29, 2012, which is hereby incorporated by reference.

TECHNICAL FIELD

The technical field generally relates to methods and apparatuses for determining abnormal conditions in an electrical system.

BACKGROUND

Typically, electrical systems of vehicles are checked during the assembly process simply by turning electrical loads on and off and verifying their operation. Unfortunately, this technique may not identify the particular faulted component or the reason for the fault.

Accordingly, it is desirable to develop more robust methods of sensing electrical abnormal conditions, such as electrical faults, in the vehicle. Additionally, it is desirable to develop methods to identify which components are exhibiting abnormal characteristics. Furthermore, other desirable features and characteristics of the present invention will become apparent from the subsequent detailed description and the appended claims, taken in conjunction with the accompanying drawings and the foregoing technical field and background.

SUMMARY

An apparatus is provided for determining an abnormal condition in an electrical system of a vehicle. In one embodiment, the apparatus includes a memory for storing data relating to normal voltage transients. The apparatus also includes a computer electrically connectable to the electrical system and in communication with the memory. The computer is configured to sense voltage transients that occur in the electrical system of the vehicle, compare the sensed voltage transients to the stored normal voltage transients, and determine if the sensed voltage transient indicates an abnormal condition in the electrical system of the vehicle.

A method is provided for analyzing an electrical system of a vehicle. In one embodiment, the method includes storing data relating to normal voltage transients in a memory of a computer. The method also includes sensing voltage transients occurring in the electrical system of the vehicle. The sensed voltage transients are compared to the stored normal voltage transients. The method further includes determining if the sensed voltage transient indicates an abnormal condition in the electrical system of the vehicle.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description.

Figure 1:
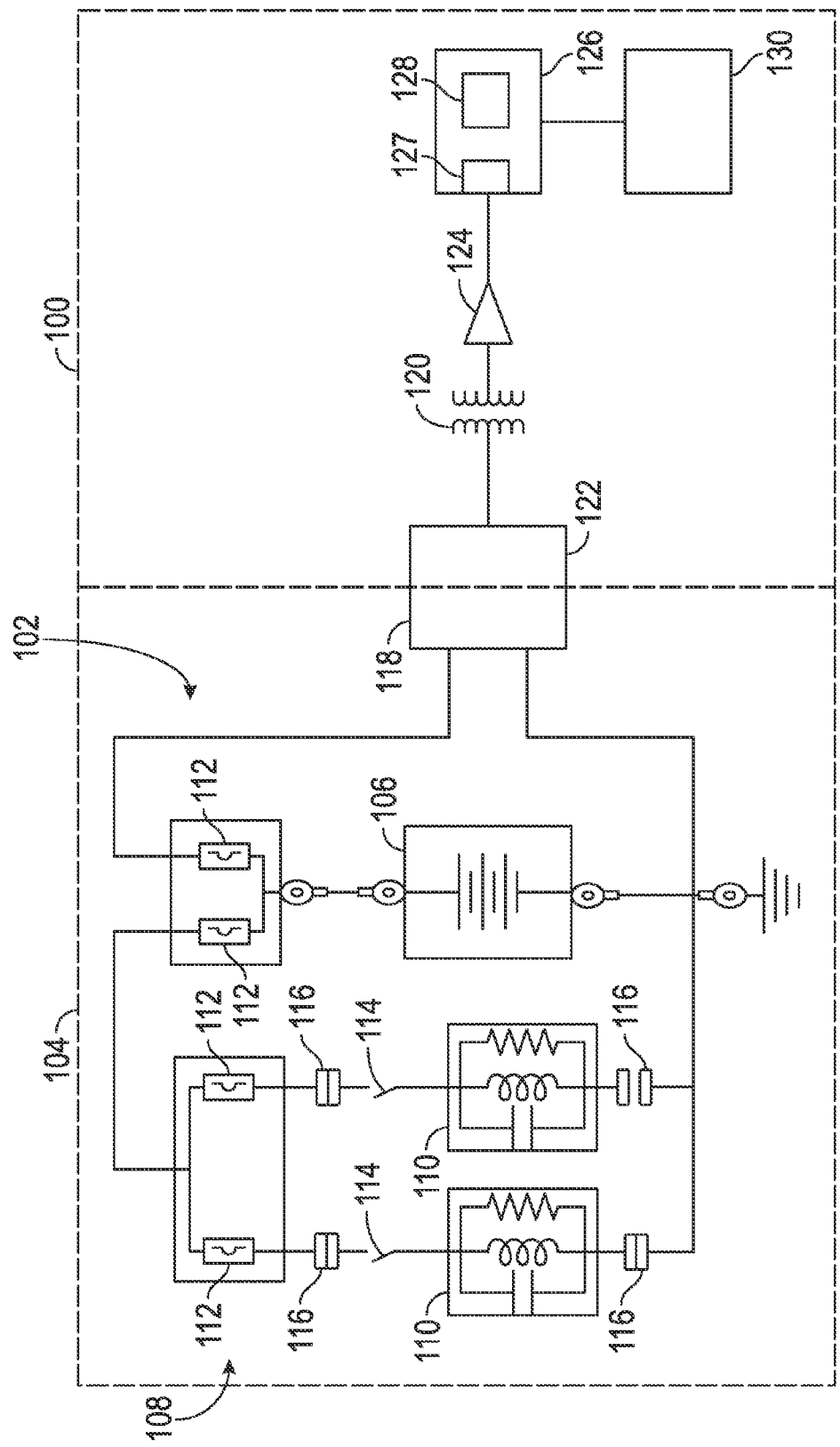
FIG. 1 is an electrical schematic block diagram of an electrical system of a vehicle coupled to an apparatus in accordance with an embodiment.

Referring to the figures, wherein like numerals indicate like parts throughout the several views, an apparatus 100 for determining an abnormal condition in an electrical system 102 is shown herein. In the exemplary embodiment, as shown in FIG. 1, the apparatus 100 may be utilized with the electrical system 102 of a vehicle 104. More specifically, the vehicle 104 of the exemplary embodiment is an automobile. However, the apparatus 100 may be utilized with other vehicles, e.g., aircraft, or non-vehicle applications.

The electrical system 102 includes a power source 106. Specifically, in the exemplary embodiment, the power source 106 is a battery (not separately numbered). The battery stores electrical energy and may include a plurality of battery cells (not separately numbered).

The electrical system 102 further includes a plurality of components 108 electrically connected to the power source 106. The components 108 may include one or more electrical loads 110. The electrical load 110 may be any device which utilizes or consumes electrical power. As just a few examples, the electrical load 110 may be an engine starter, a lamp (e.g., headlight, turn signal light, light emitting diode), a radio receiver, a solenoid, a heating element, a sensor, a computer, and an electric motor. Of course, other electrical loads 110 will be readily appreciated by those skilled in the art. As shown in FIG. 1, each electrical load 110 may be modeled as having a resistance, an inductance, and a capacitance.

The components 108 may also include one or more circuit protection elements 112, e.g., fuses or circuit breakers. The components 108 may further include one or more switches 114 for selectively connecting and/or disconnecting the electrical loads 110. Furthermore, the components 108 may include one or more connectors 116 utilized to insert and/or remove the electrical loads 110 (e.g., for maintenance or replacement).

The electrical system 102 may also include a diagnostic link connector ("DLC") 118. In the exemplary embodiment, the DLC 118 is electrically connected across the power source 106. More particularly, the DLC 118 of the exemplary embodiment provides an interface for connection of the apparatus 100 and/or other external devices to the electrical system 102 of the vehicle 104.

The apparatus 100 of the exemplary embodiment includes a pulse transformer 120 electrically connectable to the electrical system 102. More specifically, the pulse transformer 120 of the exemplary embodiment is electrically connectable to a connector 122. In turn, the connector 122 is connectable to the DLC 118 of the electrical system 102. The pulse transformer 120 produces an electrical signal corresponding to the voltage of the electrical system. The pulse transformer 120 is sized to accommodate a bandwidth of voltage transients that may be produced by at least some of the components 108 of the electrical system 102. One aspect of sizing the pulse transformer 120 is the saturation point as it relates to a smallest load 110, i.e., the load 110 that uses the least amount of power, in the system 102. As such, these voltage transients may be identifiable in the electrical signal produced by the pulse transformer 120.

The apparatus 100 of the exemplary embodiment further includes an amplifier 124 electrically connected to the pulse transformer 120. The amplifier 124 receives and amplifies the electrical signal received from the pulse transformer 120.

The apparatus 100 also includes a computer 126. In the exemplary embodiment, the computer is electrically connected to the amplifier 124 to receive the amplified electrical signal. More specifically, the computer 126 of the exemplary embodiment includes an analog-to-digital converter ("ADC") 127. As such, the computer is electrically connectable to the electrical system 102. The computer 32 may include a microprocessor, microcontroller, application specific integrated circuit ("ASIC"), and/or other logic elements (not shown) that are capable of performing computations and/or executing instructions.

The computer 126 is in communication with a memory 128 for storing data. The memory 128 may be implemented using any suitable type as appreciated by those skilled in the art, including, but not limited to, random-access memory ("RAM"), read-only memory ("ROM"), flash memory, a magnetic storage medium (e.g., a hard disk drive), and an optical storage medium (e.g., a compact disc).

In the exemplary embodiment, the memory 128 is integrated with the computer 126. The data stored on the memory 128 of the exemplary embodiment includes data relating to normal voltage transients of the electrical system 102.

The apparatus 100 of the exemplary embodiment further includes a display 130 in communication with the computer 126. The display 130 receives data, information, and/or instructions from the computer 126 to convey information to a user, as is well known by those skilled in the art.

The computer 126 is configured to execute a method of determining a fault in the electrical system 102. However, other techniques for executing the method will be appreciated and, therefore, the method described herein may be executed with devices other than the described apparatus 100.

The method includes sensing voltage transients that occur in the electrical system 102. This is achieved by sensing the voltage of the electrical system 102 over time with a sufficient sensitivity and sample rate. The sensed voltage transients may be saved in the memory 128. Accordingly, the method also includes storing data related to the sensed voltage of the electrical system 102.

As described above, data relating to normal voltage transients of the electrical system 102 is stored in the memory 128. Therefore, the method may also include storing data related to normal voltage transients of the electrical system 102.

Figure 2:
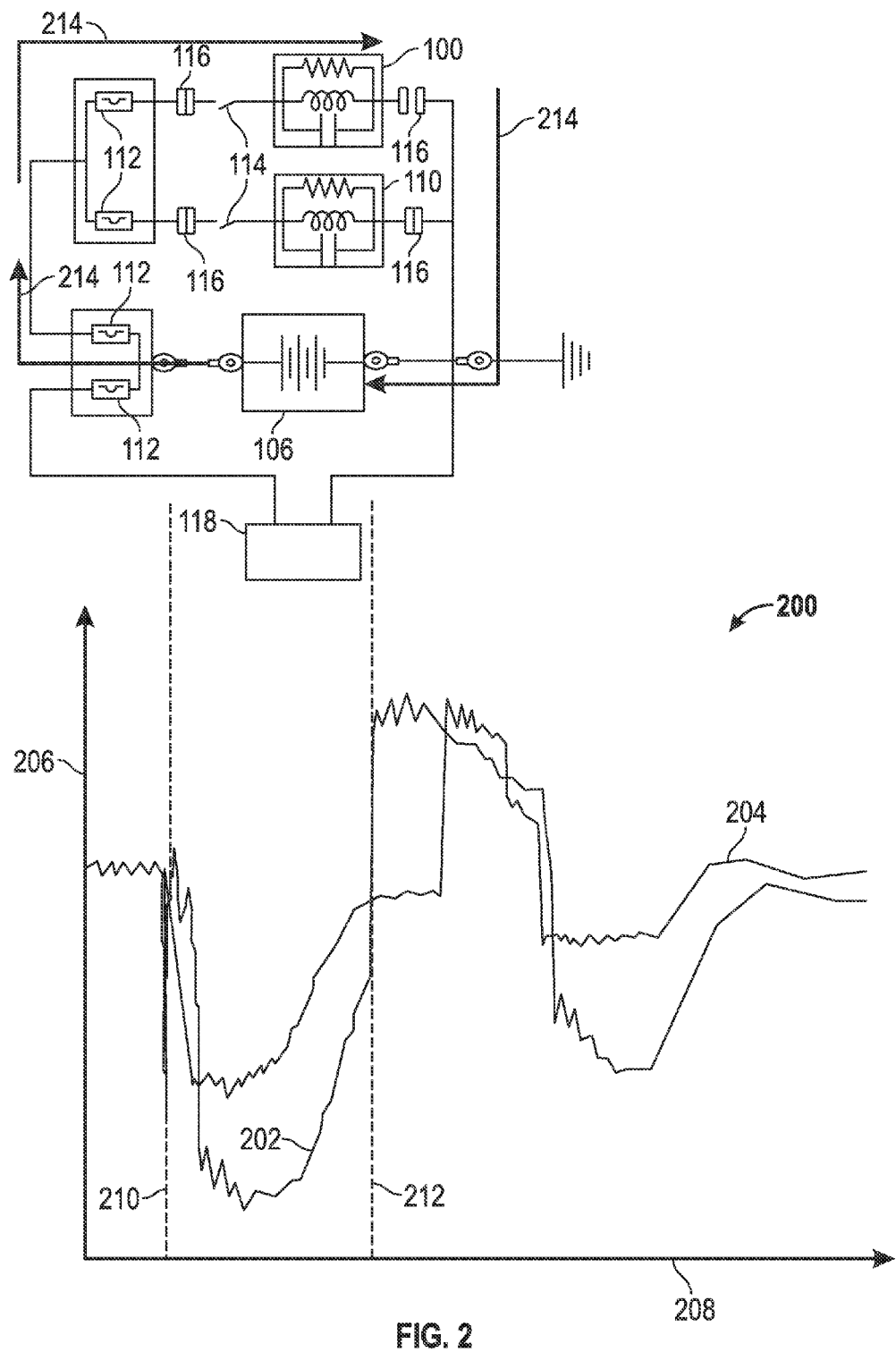
FIG. 2 is a graph showing a normal voltage transient in comparison with an abnormal sensed voltage transient in accordance with an embodiment.

The method further includes comparing the sensed voltage transients to stored normal voltage transients. A chart 200 illustrating a normal voltage transient 202 and a sensed voltage transient 204 is shown in FIG. 2. A vertical axis 206 of the chart 200 corresponds to voltage and a horizontal axis 208 corresponds to time. The transients 202, 204 shown in FIG. 2 reflect the powering on of one of the loads 110, for instance, by closing the switch 114 corresponding to the load 110. The switch 114 may be closed manually by the user or automatically by the computer 126. In the exemplary embodiment shown in FIG. 2, the sensed voltage transient 204 reflects an abnormal condition of the load 110. More specifically, the sensed voltage transient 204 shown in FIG. 2 is a faulted voltage transient illustrating a load 110 that has been disconnected from the circuit. The comparison of the transients 202, 204 may include the comparison of one or more specific factors. These factors include, but are not limited to, the amount of voltage drop, the time between the beginning of a voltage drop and a voltage spike, the length of time of the voltage drop, and the length of time of the voltage spike.

The method also includes determining if the sensed voltage transient indicates an abnormal condition in the electrical system 102. More specifically, in the exemplary embodiment, abnormal conditions in specific components 108 of the electrical system 102 may be determined. This determination may be accomplished using deviations between at least one of the specific factors described above and/or other factors. A suitable range of deviations of the sensed voltage transient 204 from the normal voltage transient 202 may be established to prevent unwarranted determination of abnormal conditions.

If an abnormal condition is determined, then the user may be alerted to the abnormal condition, such that corrective steps may be taken to repair abnormal aspect of the electrical system 102. As such, the method further includes alerting the user to the abnormal condition in response to the determination that the sensed voltage transient indicates the abnormal condition. In the exemplary embodiment, the display 130 of the apparatus 100 may be utilized to inform the user of the abnormality. However, other annunciation devices (not shown), e.g., a speaker, a light, etc., may be utilized to inform the user of the abnormal condition.

The method may also include calculating a length of a conductive path (not numbered) electrically connecting the component 108 exhibiting the abnormal condition (e.g., a faulted component) to the power source 106. The calculation of the length is based on the normal voltage transient 204 associated with the particular component 108 that is faulted. Specifically, the distance can be calculated with the formula $$\text{Length}=(T_2-T_1) \times V_{OP},$$

where $T_1$ is a first time 210 corresponding to a voltage drop in the normal voltage transient 202 for the particular component 108, $T_2$ is a second time 212 corresponding to a voltage rise in the normal voltage transient 204 for the particular component 108, and $V_{OP}$ is the velocity of propagation in a circuit due to the fault.

By determining the length of the conductive path, the identity of the particular component 108 that is exhibiting the abnormal condition may potentially be determined. The conductive path in the illustrated embodiment, shown generally as 214 in FIG. 2, runs from a positive terminal of the power source 106, through each of the components 108, and back to a negative terminal of the power source 106. As such, every component 108 and connection is observable in the sensed voltage transient 204. In the exemplary embodiment, the memory 128 is configured to store data related to lengths of the conductive paths between the power source 106 and each of the plurality of components 108. The method may include determining an identity of the component 108 exhibiting the abnormal condition based at least partially on the length of the conductive path and the data related to lengths of the conductive paths.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method of analyzing an electrical system of a vehicle comprising:
    storing data relating to normal voltage transients in a memory a computer;
    powering the electrical system of the vehicle with a battery providing a generally constant DC voltage;
    sensing voltage transients occurring in the electrical system of the vehicle;
    comparing the sensed voltage transients to the stored normal voltage transients;
    determining if the sensed voltage transient indicates an abnormal condition in a component of the electrical system of the vehicle; and
    calculating the length of a conductive path electrically connecting the component exhibiting the abnormal condition to the battery utilizing the formula $$\text{Length} = (T_2 - T_1) \times V_{OP},$$

where $T_1$ is the first time corresponding to a voltage drop in the normal voltage transient for the component exhibiting the abnormal condition, $T_2$ is the second time corresponding to the voltage rise in the normal voltage transient for the component exhibiting the abnormal condition, and $V_{OP}$ is the velocity of propagation in a circuit due to the fault.

2. A method as set forth in claim 1 further comprising providing an alert for the abnormal condition in response to the determination that the sensed voltage transient indicates the abnormal condition.

3. A method as set forth in claim 1 further comprising selectively connecting and/or disconnecting a load of the vehicle while sensing voltage transients.

4. A method as set forth in claim 1 further comprising determining an identity of the component exhibiting the abnormal condition based at least partially on the length of the conducive path.

5. A method as set forth in claim 4 wherein determining the identity of the faulted components includes storing data related to lengths of conductive paths between the battery and each of the plurality of components and comparing the calculated length of the conductive path to the data related to the lengths.

6. A method a set forth in claim 4 further comprising providing an alert as to which component is exhibiting the abnormal condition.

7. An apparatus for determining an abnormal condition in an electrical system of a vehicle having a battery providing a generally constant DC voltage, comprising:
    a memory for storing data relating to a normal voltage transients; and
    a computer electrically connectable to the electrical system and in communication with said memory, said computer configured to
    sense voltage transients that occur in the electrical system of the vehicle powered by the battery,
    compare the sensed voltage transients to the stored normal voltage transients,
    determine if the sensed voltage transient indicates an abnormal condition in a component of the system, and
    calculate the length of a conductive path electrically connecting the component exhibiting the abnormal condition to the battery utilizing the formula $$\text{Length} = (T_2 - T_1) \times V_{OP},$$

where $T_1$ is the first time corresponding to a voltage drop in the normal voltage transient for the component exhibiting the abnormal condition, $T_2$ is the second time corresponding to the voltage rise in the normal voltage transient for the component exhibiting the abnormal condition, and $V_{OP}$ is the velocity of propagation in a circuit due to the fault.

8. An apparatus as set forth in claim 7 further comprising a pulse transformer electrically connected between the electrical system and said computer.

9. An apparatus as set forth in claim 8 further comprising an amplifier electrically connected between said pulse transformer and said computer.

10. An apparatus as set forth in claim 7 further including a display configured to provide an alert to the abnormal condition in response to the determination that the sensed voltage transient indicates the abnormal condition.

11. An apparatus as set forth in claim 7 wherein said memory is configured to store data related to lengths of the conductive paths between the battery and each of the plurality of components.

12. An apparatus as set forth in claim 11 wherein said computer is configured to determine an identity of the component exhibiting the abnormal condition based at least partially on the length of the conductive path and the data related to lengths of the conductive paths.

13. An apparatus as set forth in claim 12 further including a display configured to provide an alert to which component is exhibiting the abnormal condition.

* * * * *